(12) United States Patent
Noshadi et al.

(10) Patent No.: US 8,085,538 B2
(45) Date of Patent: Dec. 27, 2011

(54) FLUID-COOLED ELECTRONIC HOUSING ASSEMBLY AND SYSTEM

(75) Inventors: Valod Noshadi, Ettlingen (DE); Juri Woinkoff, Karlsruhe (DE)

(73) Assignee: Haman Becker Automotive Systems GmbH, Karlsbad (DE)

( * ) Notice: Subject to any disclaimer, the term of this patent is extended or adjusted under 35 U.S.C. 154(b) by 111 days.

(21) Appl. No.: 12/605,307

(22) Filed: Oct. 23, 2009

(65) Prior Publication Data

US 2010/0195285 A1    Aug. 5, 2010

(30) Foreign Application Priority Data

Oct. 24, 2008   (EP) ..................... 08018684

(51) Int. Cl.
*H05K 7/20* (2006.01)
(52) U.S. Cl. ...................... 361/699; 361/688
(58) Field of Classification Search .......... 361/688–689, 361/698–699
See application file for complete search history.

(56) References Cited

U.S. PATENT DOCUMENTS

| | | | | |
|---|---|---|---|---|
| 4,587,593 | A * | 5/1986 | Liautaud et al. | 361/690 |
| 6,771,501 | B2 * | 8/2004 | Coleman et al. | 361/700 |
| 7,233,491 | B2 * | 6/2007 | Faneuf et al. | 361/689 |
| 7,710,721 | B2 * | 5/2010 | Matsuo et al. | 361/699 |
| 7,729,117 | B2 * | 6/2010 | Schweinbenz et al. | 361/699 |
| 2007/0253164 | A1 * | 11/2007 | Matsuo et al. | 361/699 |
| 2008/0049476 | A1 * | 2/2008 | Azuma et al. | 363/131 |
| 2008/0225478 | A1 * | 9/2008 | Goettert et al. | 361/687 |
| 2008/0273307 | A1 * | 11/2008 | Campbell et al. | 361/699 |

FOREIGN PATENT DOCUMENTS

| | | |
|---|---|---|
| DE | 19645635 C1 | 4/1998 |
| EP | 0968885 A2 | 1/2000 |
| GB | 2183304 A | 6/1987 |

* cited by examiner

*Primary Examiner* — Gregory Thompson
(74) *Attorney, Agent, or Firm* — The Eclipse Group LLP

(57) ABSTRACT

A fluid-cooled electronic housing assembly ("FCEHA") configured for mounting within a vehicle is described. The FCEHA may be part of a fluid-cooled electronic system ("FCES") that includes the FCEHA and a plurality of electronic components. The FCEHA is capable of providing effective cooling for the FCES while maintaining a small space requirement by utilizing a fluid cooling system that cools the housing of FCEHA. In general, the FCEHA includes a cooling-fluid channel through a heat sink that, in operation, allows a cooling fluid/liquid to flow throw the cooling-fluid channel and cool off the FCEHA more efficiently that air convection because the cooling fluid is more efficient in heat transport.

21 Claims, 7 Drawing Sheets

FLUID-COOLED ELECTRONIC HOUSING ASSEMBLY AND SYSTEM

RELATED APPLICATIONS

This application claims priority of European Patent Application Serial Number 08 018 684.4, filed on Oct. 24, 2009, titled VEHICLE ELECTRONIC SYSTEM WITH FLUID COOLING, which application is incorporated in its entirety by reference in this application.

BACKGROUND OF THE INVENTION

1. Field of the Invention

This invention relates to a vehicle electronic system using a cooling fluid for removing the heat generated by the heat source or sources within the electronic system.

2. Related Art

At present with the advances in electronics, multimedia entertainment systems, and telecommunications, there is an strong demand for integrating ever more complex multimedia entertainment and telecommunication systems (herein referred to as "infotainment" systems) into vehicles such as automobiles, water crafts, motorcycles, and aircraft. Increasingly, users desire vehicles that integrate infotainment systems that include infotainment components such as, for example, AM, FM, digital, and satellite radios, cassette players, CD and DVD players, MP3® players and interfaces, iPod® interfaces, navigation and GPS systems, video sensors, video game consoles, hands-free cellular telephone systems or interfaces, Bluetooth® interfaces, Internet interfaces, etc. To meet these demands vehicle manufactures have designed their vehicles to accept vehicle electronic systems (typically from third party manufactures) that integrate as many of these infotainment components as possible.

Unfortunately, the result of integrating many of these infotainment components into vehicle electronic systems results in thermal problems because of the increasing packing density resulting from more and more electronic devices being integrated in a limited space and of the increasing power demands of my of these infotainment components. As an example, the trend towards superior graphical performance and the increasing demand for speech and sound processing lead to the implementation of more power hungry faster and more specialized processors as well as higher memory capacities that also require more power. In addition, the operating temperature limits of the vehicle electronic devices impose restrictions to the hardware design engineers in the selection of proper processors because many of these powerful processors for use in these types of infotainment components are specified only for consumer electronics and those that are specified for vehicle applications are typically expensive or have the lowest possible upper temperature limits. Thus, these increased power factors result in these infotainment components producing more heat which results in higher operating temperatures for the vehicle electronic devices that incorporate these infotainment components. To protect the electronic components in these vehicle electronic devices, the greater heat produced by these infotainment components needs to be compensated for with proper cooling systems and methods.

Unfortunately, at present, vehicle electronic devices are cooled in general through thermal conduction through their housings to the vehicles surrounding walls, radiation heat exchange with the surrounding air, and air convection. As an example, in many cases in the automotive environment where natural thermal convection does not sufficiently allow the vehicle electronic device to operate within the temperature limits specified for given automotive applications, fan systems are typically utilized to drive the surrounding air through the vehicle electronic device in order to enhance the cooling of the vehicle electronic device by utilizing forced convection. However, many automotive manufactures need to mount different vehicle electronic devices in areas that typically have limited space such as the dashboard and as such request that these vehicle electronic devices function in temperatures environments up to, for example, about 85° C. Unfortunately, the problems associated with the limitations of air cooling and the full functional operation of the vehicle electronic devices may result in these devices only be guaranteed to properly operate up to about 65° C. in environmental temperature with possibly short temperature busts of up to about 70° C. Therefore, there is a need for a vehicle electronic device capable of overcoming these problems.

SUMMARY

A fluid-cooled electronic housing assembly ("FCEHA") configured for mounting within a vehicle is described. The FCEHA may be part of a fluid-cooled electronic system ("FCES") that includes the FCEHA and a plurality of electronic components. The FCEHA is capable of providing effective cooling for the FCES while maintaining a small space requirement by utilizing a fluid cooling system that cools the housing of FCEHA. In general, the FCEHA includes a cooling-fluid channel through a heat sink that, in operation, allows a cooling fluid/liquid to flow throw the cooling-fluid channel and cool off the FCEHA more efficiently that air convection because the cooling fluid is more efficient in heat transport.

In the FCEHA, the plurality of electronic components may be the electronic components of one or more complex multimedia entertainment and telecommunication systems (herein referred to as "infotainment" systems) that are integrated in the FCES. Generally, an infotainment system integrated in the FCES may include infotainment components such as, for example, AM, FM, digital, and satellite radios, cassette players, CD and DVD players, MP3® players and interfaces, iPod® interfaces, navigation and GPS systems, video sensors, video game consoles, hands-free cellular telephone systems or interfaces, Bluetooth® interfaces, Internet interfaces, etc. The electronic components may be active or passive electronic devices including, for example, transistors, diodes, resistors, integrated circuits ("ICs") such as memory units, processors, digital signal processors ("DSPs"), application specific integrated circuits ("ASICs"), power supplies, or other electrical/electronic devices, components, modules, or discrete elements.

As an example of an implementation, the FCEHA may include a plurality of vertical side-walls and a heat sink attached to the plurality of vertical side-walls. The heat sink may include a plurality of vertical channel-walls and a horizontal channel-wall positioned between the plurality of vertical channel-walls. The plurality of vertical channel-walls and the horizontal channel-wall define a cooling-fluid channel within the heat sink. The plurality of side-walls and the heat sink define an inner space where the inner space may be configured to house the plurality of electronic components. The plurality of vertical side-walls may include a front side-wall, two mounting side-walls, and a back side-wall, where the two mounting side-walls are configured to be mounted to a support structure within the vehicle and the back side-wall is configured to be mounted with at least one electronic connector to electrically connect the FCES to the vehicle.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
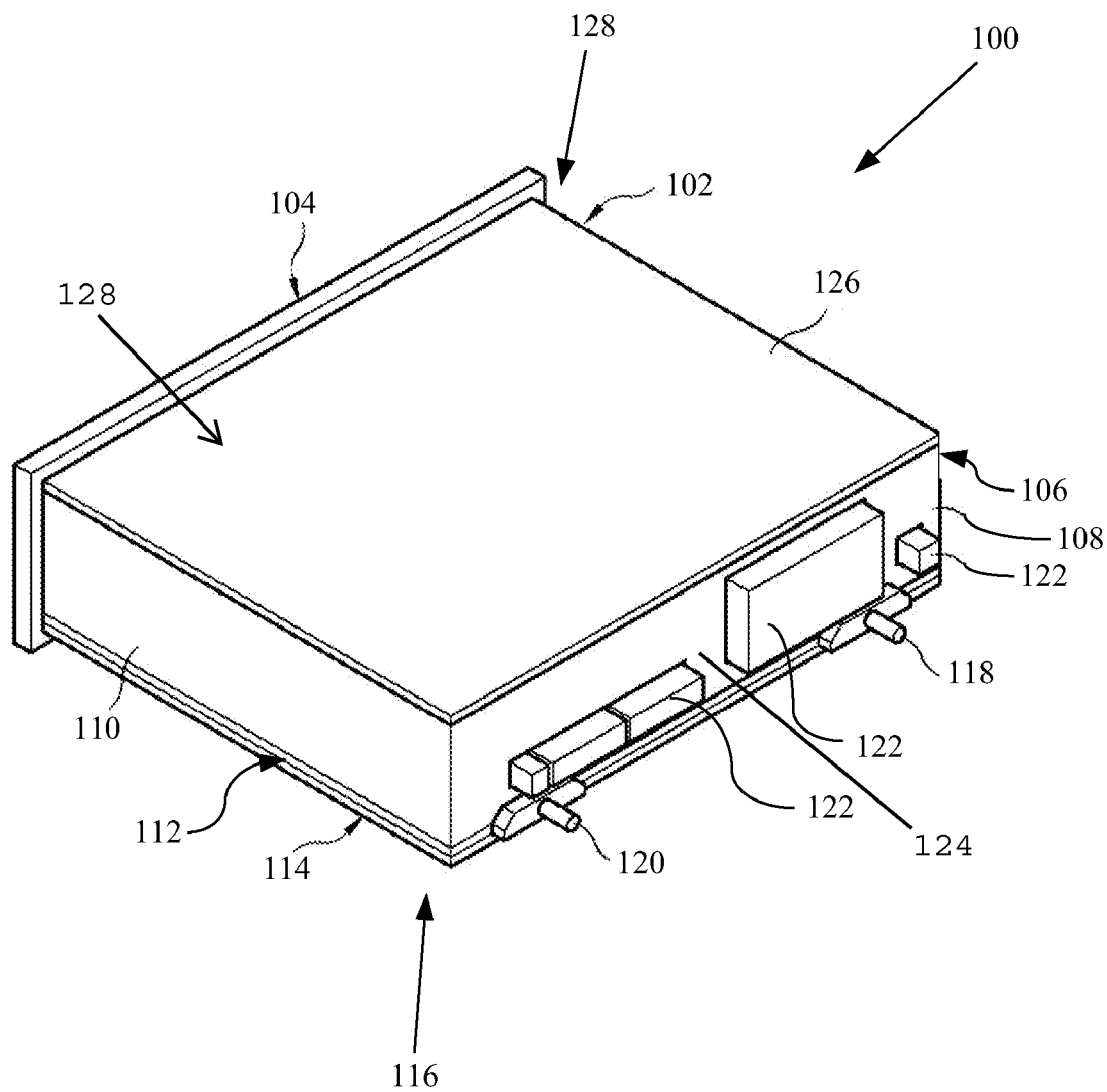
FIG. 1 is a perspective rear view of an example of an implementation of fluid-cooled electronic system ("FCES") with a fluid-cooled electronic housing assembly ("FCEHA") in accordance with the invention.

A fluid-cooled electronic housing assembly ("FCEHA") configured for mounting within a vehicle is described. The FCEHA may be part of a fluid-cooled electronic system ("FCES") that includes the FCEHA and a plurality of electronic components. The FCEHA is capable of providing effective cooling for the FCES while maintaining a small space requirement by utilizing a fluid cooling system that cools the housing of FCEHA. In general, the FCEHA includes a cooling-fluid channel through a heat sink that, in operation, allows a cooling fluid/liquid to flow throw the cooling-fluid channel and cool off the FCEHA more efficiently that air convection because the cooling fluid is more efficient in heat transport. As a consequence, the operating temperatures of any electronic components that act as heat sources (such as, for example, processors) are lowered as compared to air cooling systems, which generally results in longer lifetimes for these electronic components. Additionally, since no cooling fans are needed, the noise of a fan can be avoided and there will be no fan induced dust accumulating in the FCEHA. Furthermore, the FCEHA reduces any humidity condensation problems. As an example, the cooling fluid may be water, water with chemical additives, oil, a synthetic liquid, or some other similar cooling liquid.

In the FCEHA, the plurality of electronic components may be the electronic components of one or more complex multimedia entertainment and telecommunication systems (herein referred to as "infotainment" systems) that are integrated in the FCES. Generally, an infotainment system integrated in the FCES may include infotainment components such as, for example, AM, FM, digital, and satellite radios, cassette players, CD and DVD players, MP3® players and interfaces, iPod® interfaces, navigation and GPS systems, video sensors, video game consoles, hands-free cellular telephone systems or interfaces. Bluetooth® interfaces. Internet interfaces, etc. The electronic components may be active or passive electronic devices including, for example, transistors, diodes, resistors, integrated circuits ("ICs") such as memory units, processors, digital signal processors ("DSPs"), application specific integrated circuits ("ASICs"), power supplies, or other electrical/electronic devices, components, modules, or discrete elements.

As an example of an implementation, the FCEHA may include a plurality of vertical side-walls and a heat sink attached to the plurality of vertical side-walls. The heat sink may include a plurality of vertical channel-walls and a horizontal channel-wall positioned between the plurality of vertical channel-walls. The plurality of vertical channel-walls and the horizontal channel-wall define a cooling-fluid channel within the heat sink. The plurality of side-walls and the heat sink define an inner space where the inner space may be configured to house the plurality of electronic components. The plurality of vertical side-walls may include a front sidewall, two mounting side-walls, and a back side-wall, where the two mounting side-walls are configured to be mounted to a support structure within the vehicle and the back side-wall is configured to be mounted with at least one electronic connector to electrically connect the FCES to the vehicle.

Turning to FIG. 1, a perspective rear view is shown of an example of an implementation of a fluid-cooled electronic system ("FCES") 100 for incorporation into a vehicle (not shown). The FCES 100 may include a plurality of electronic components (not shown) and a fluid-cooled electronic housing assembly ("FCEHA") 102. The FCEHA 102 may include a plurality of vertical side-walls 104, 106, 108, and 110 and a heat sink 112 attached to the plurality of vertical side-walls 104, 106, 108, and 110. The FCEHA 102 may also include a cover plate 114 attached and/or mounted to the heat sink 112 on the bottom side 116 of the FCEHA. The plurality of vertical side-walls 104, 106, 108, and 110 may include a front side-wall 104, two mounting side-walls 106 and 110, and a back side-wall 108. The back side-wall 108 may include a fluid inlet 118, fluid outlet 120, and at least one electronic connector 122 that extend through the back side-wall 108 and out to the back side 124 of the FCEHA 102. The FCEHA 102 may also include a top-side plate 126 on the top side 128 of the FCEHA 102. The at least one electronic connector 122 may be any type of electrical or electronic connector that allows FCES 100 to either receive or send electrical power, communication signals from external components such as, for example, an external antenna, speaker and microphone, connections, vehicle communication bus, vehicle sensor inputs and outputs, or other types of electronic and/or electrical devices typically associated with infotainment components.

The fluid inlet 118 and fluid outlet 120 are fluid connectors that are connected to the cooling-fluid channel (not shown) within the FCEHA 102 and also may be connected to a cooling-fluid supply (not shown) provided by either the vehicle or other device and/or system (not shown) located in the vehicle. The combination of the cooling-fluid supply, fluid inlet 118, cooling-fluid channel, and fluid outlet 120 form a cooling-fluid circuit (not shown). In an example of operation, the fluid inlet 118 feeds the cooling fluid from the cooling fluid supply to the cooling-fluid channel which then exits via the fluid outlet 120 back to the cooling-fluid supply. Additionally, the cooling-fluid circuit may include optional (and not shown) components such as, for example, a pump, a heat sink, a coolant-fluid reservoir and connection tubes. Some of these components optionally may be incorporated in the FCES 100, the vehicle, or both. As an example, the connection of the fluid inlet 118 and fluid outlet 120 to the cooling-fluid circuit may be realized by quick couplers (not shown) that allow for an easy connection and disconnection at the fluid inlet 118 and fluid outlet 120. In this example, the fluid inlet 118 and fluid outlet 120 are shown as attached to back side-wall 108, however it is appreciated by those skilled in the art that each one or both fluid inlet 118 and fluid outlet 120 may be connected to different vertical side-walls 104, 106, 108, and 110 and/or to the top-side plate 126 and cover plate 114.

Figure 2:
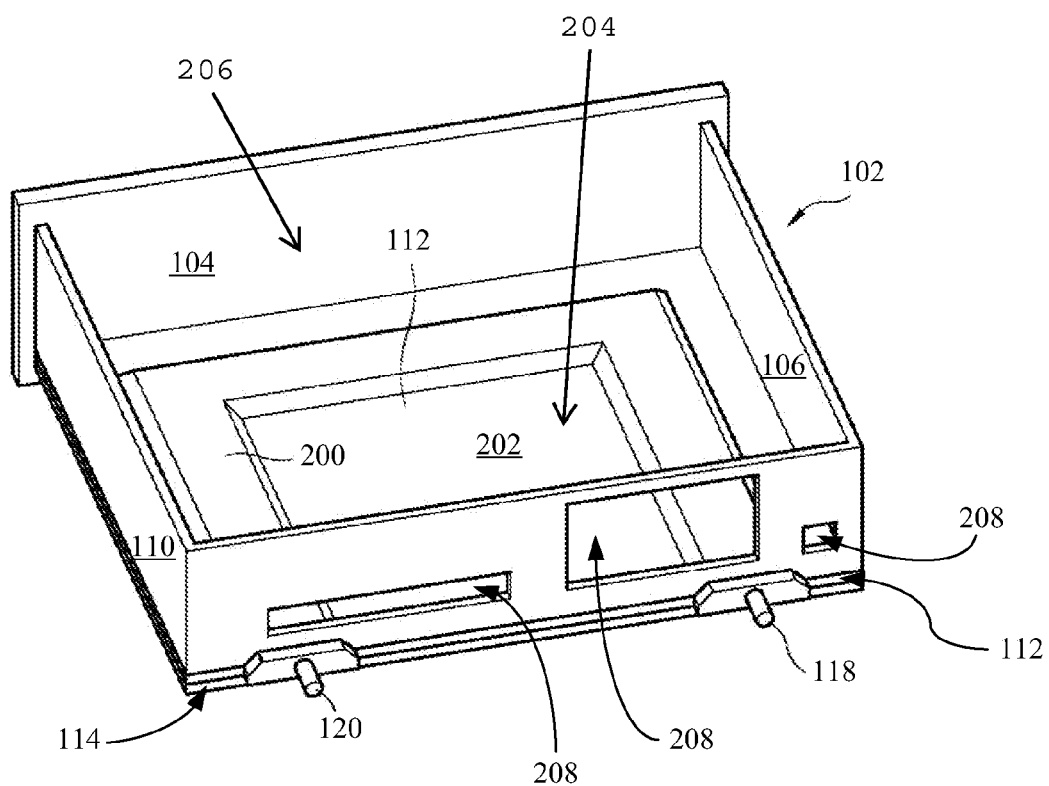
FIG. 2 is a perspective rear view of an example of an implementation of the FCEHA shown in FIG. 1 with a top side removed from the top of the FCEHA.

In FIG. 2, a perspective rear view of an example of an implementation of the FCEHA 102 with the top-side plate 126 removed from the top side 128 of the FCEHA 102 is shown. In this view, the heat sink 112 and cooling-fluid channel 200 are shown. In this example, the heat sink includes a heat sink top-surface 202 and the cooling-fluid channel 200 from the heat sink top-surface to define a heat sink recessed-area 204. The plurality of side-walls 104, 106, 108, and 110 and the heat sink top-surface 202 define an inner space 206. The heat sink recessed-area 204 may be formed by a trench (not shown) within a heat sink bottom-surface (not shown) of the heat sink 112. The cover plate 114 then is attached and/or mounted to the heat sink bottom-surface of the heat sink 112. The FCEHA 102 may also include a plurality of pass-through apertures 208 that allow for the mounting and/or attaching of the at least one electronic connector 122.

The heat sink 112 is a plate that extends substantially over the complete surface area of the FCEHA 102 covering the lower portion of the inner space 206. The heat sink 112 is generally composed of a good heat conducting material such as a metal, alloy, or metallic material. In this example, the heat sink 112 includes the heat sink recessed-area 204 having a U-shaped form that extends through a major portion of the heat sink top-surface 202. As appreciated, this heat sink recessed-area 204 corresponds to the path of the cooling-fluid channel 200 through the heat sink 112 and starts and ends at the fluid inlet 118 and fluid outlet 120. As described in more detail below, the heat sink recessed-area 204 allows for greater thermal conduction of any heat sources (such as the electronic components described previously above) within the inner space 206. The length, width, and path of the heat sink recessed-area may vary depending on the number of heat sources from the electronic components to be cooled and/or the space requirements within the FCEHA 102.

In this implementation, the cooling-fluid channel 200 is defined on three sides by the heat sink recessed-area 204 and the fourth side being defined by the cover plate 114 mounted and/or attached to the heat sink bottom-surface (not shown). As an alternative implementation (not shown), the heat sink 112 may not have a heat sink recessed-area 204 because the heat sink 112 plate may be thick enough to have the cooling-fluid channel 200 completely within thickness of the heat sink 112. In this example, the cooling-fluid channel 200 is defined by the walls of a trench cut within the heat sink bottom surface and the bottom side being defined by cover plate 114. In both of these examples, the cover plate, similar to the heat sink 112, is generally composed of a good heat conducting material such as a metal, alloy, or metallic material. The cover plate 114 and heat sink 112 may be either removably mounted or permanently attached to each other. If they cover plate 114 and heat sink 112 are permanently attached they be attached utilizing a brazing process.

It is appreciated that while the heat sink 112 is shown to be at the bottom of the FCEHA 102, alternatively, the heat sink 112 may be at the top of the FCEHA 102 or located somewhat in the middle of the FCEHA 102 such that the heat sink 112 would divide the FCEHA 102 into two inner surfaces—one above the heat sink 112 and the top-side plate 126 and the other below the heat sink 112 and above the bottom of the FCEHA 102. In this example, electronic components may be located in the FCEHA 102 both above and below the heat sink 112. In this example, the cover plate 114 may be similarly shaped as the heat sink plate in order to increase the cooling surface area.

Figure 3:
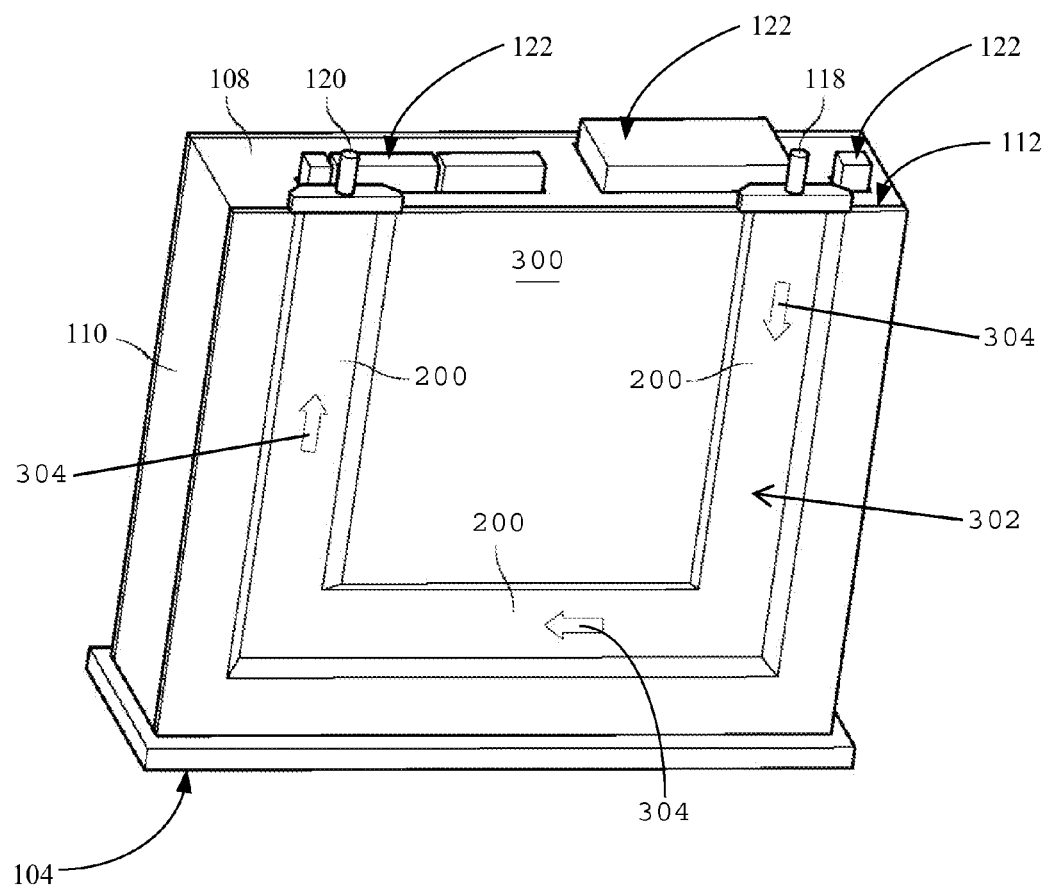
FIG. 3 is a perspective bottom view of the FCEHA shown in FIG. 1 with a cover plate removed from the bottom of the FCEHA.
Figure 4:
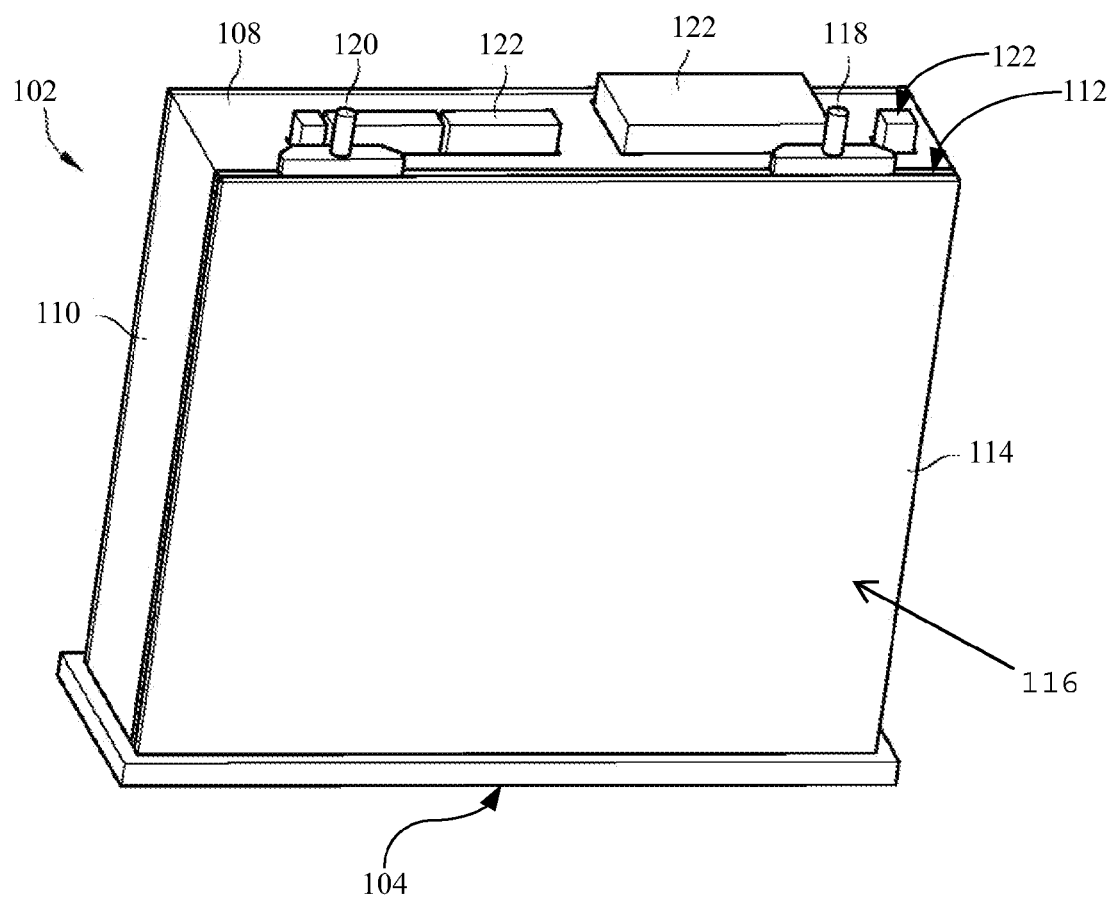
FIG. 4 is a perspective view of the FCEHA shown in FIG. 3 with the cover plate mounted on the bottom of the FCEHA.

Turning to FIG. 3, in FIG. 3 a perspective bottom view of the FCEHA 102 with the cover plate 114 removed from the bottom of the FCEHA 102 is shown. The heat sink 112 includes the cooling-fluid channel 200 shown as a trench 300 cut into the heat sink bottom-surface 302. In this example, the path of the cooling fluid is schematically shown by the cooling fluid directional arrows 304 shown in FIG. 3. As described before, in operation, the cooling fluid enters the FCEHA 102 at the fluid inlet 118 follows the trench 300 in the U-shaped form and exits the FCEHA 102 at the fluid outlet 120. In FIG. 4, a perspective view of the FCEHA 102 with the cover plate 114 mounted and/or attached on the bottom side 116 of the of the FCEHA 102 is shown.

As can be seen from FIGS. 1 to 4, the cooling system provided by the FCEHA 102 utilizes a small space, but still allows an effective cooling of any heat sources produced by the electronic devices in the FCES 100. The small space is a result of utilizing a cooling system that is produced by the cover plate 114 and the heat sink 112 being attached and/or mounted to each other, where the heat sink recessed-area 204 provides additional the space for the movement of the volume of cooling fluid. It is appreciated that utilizing a cooling fluid in this situation transfers the generated heat from the electronic components by direct convection better than air convention.

Figure 5:
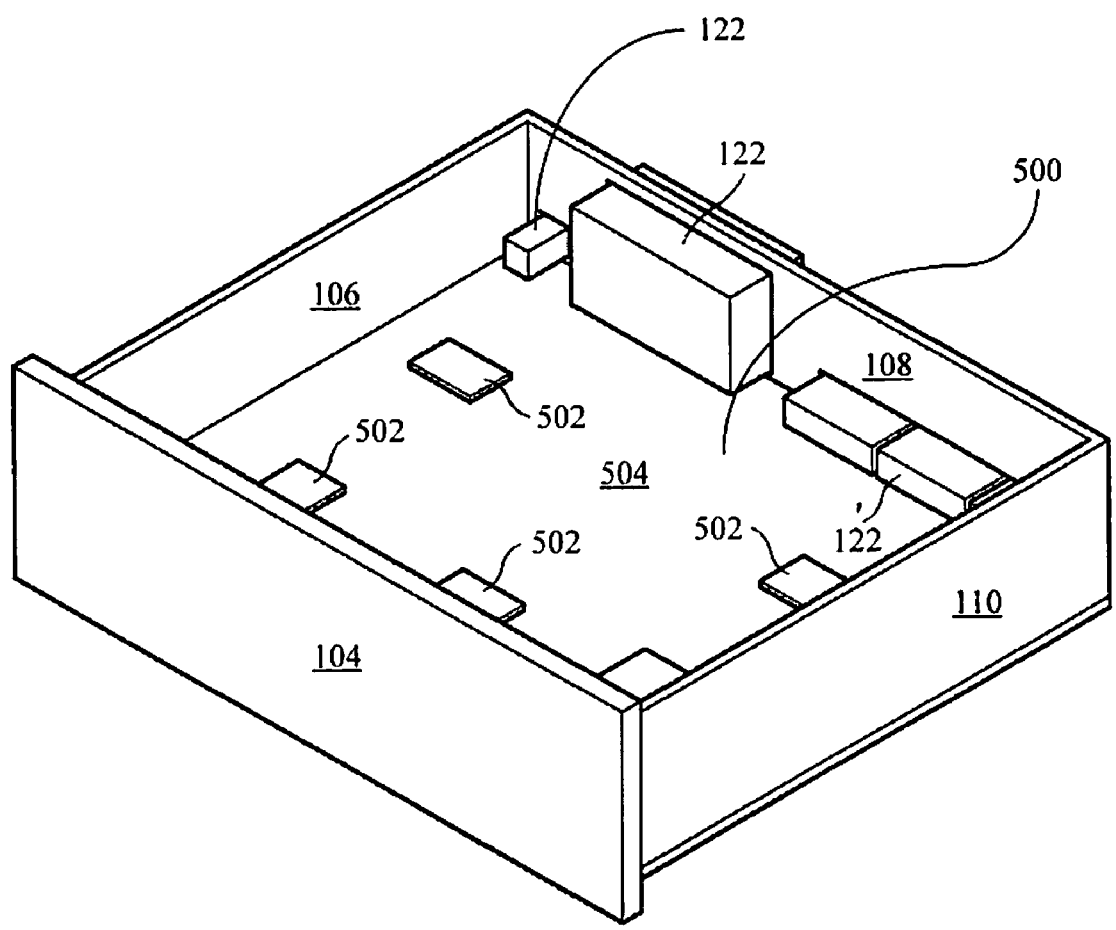
FIG. 5 is a perspective front view of the FCEHA shown in FIG. 1 with the top side removed from the top of the FCEHA.
Figure 6:
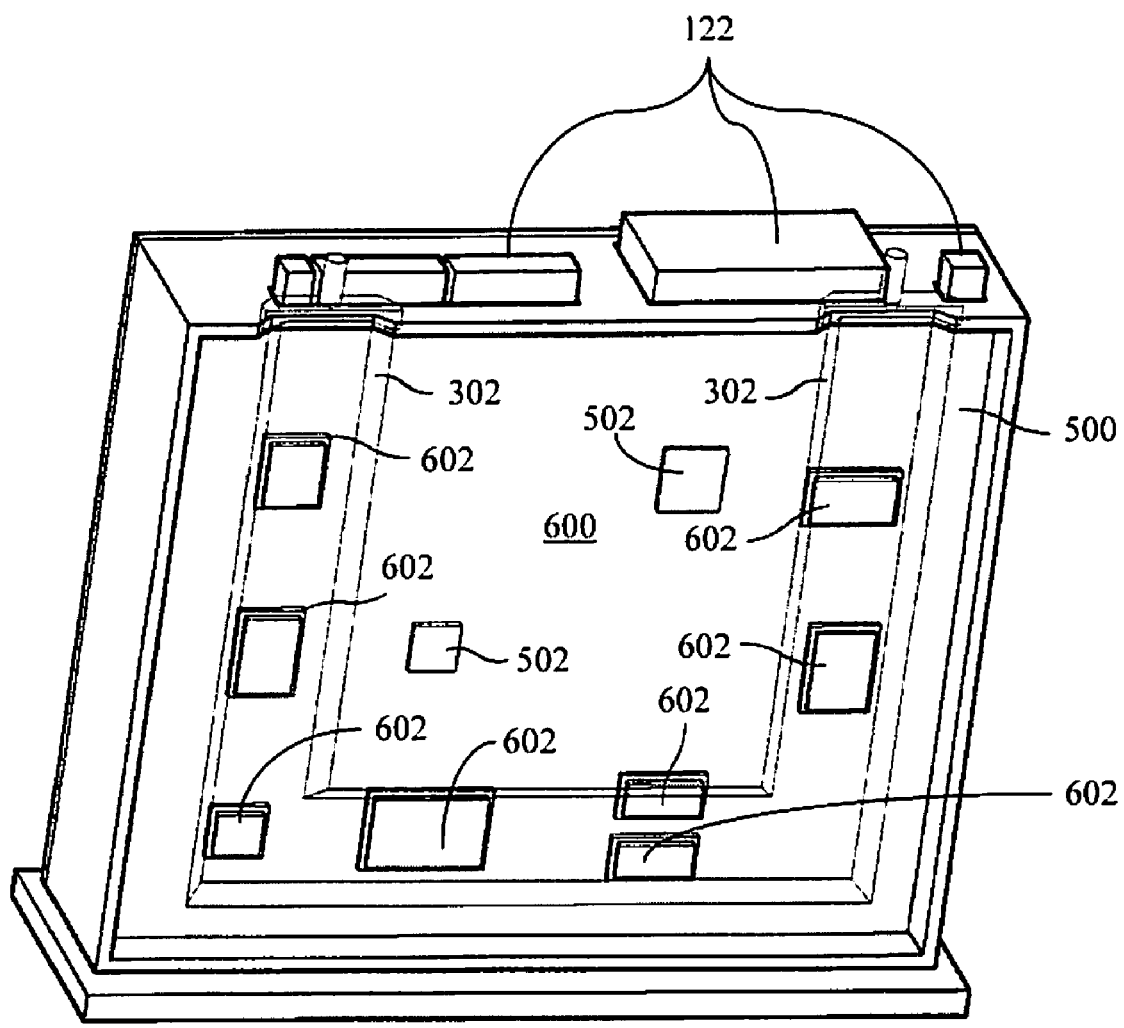
FIG. 6 is a perspective bottom view of the FCEHA shown in FIG. 1 with the cover plate and a heat sink removed from the bottom of the FCEHA.

Turning to FIGS. 5 and 6, in FIG. 5, a perspective front view of the FCEHA 102 with the top-side plate 126 removed from the top side 128 of the FCEHA 102. Similarly, in FIG. 6, perspective bottom view of the FCEHA 102 with the cover plate 114 and a heat sink 112 removed from the bottom side 116 of the FCEHA 102. In these examples, a printed circuit board ("PCB") 500 is shown that includes a plurality of electronic components 502 that act as heat sources.

The plurality of electronic components 502 may be provided on the upper surface 504 of the PCB 500 and the lower surface 600 of the PCB 500. The plurality of electronic components 502 placed on the lower surface 600 face the heat sink 112 and may be positioned in a fashion that places them directly in connection with the heat sink 112 via the heat sink recessed-area 204. The placement of the electronic components 502 and the design of the path of the cooling-fluid channel 200 is designed to improve the heat transfer of the electronic components 502 through the cooling-fluid channel 200. In general, electronic components 502 that generate a large amount of heat may be placed at positions at which directly contact or are in close proximity to the heat sink recessed-area 204, whereas other electronic components 502 that generate less heat may be positioned at other locations on the PCB 500. Additionally, heat conducting pads 602 may be placed between the heat sink 112 and the PCB 500 to improve the heat transfer from the electronic components 502 to the heat sink 112. As can be seen in FIG. 6, several electronic components 502 may be cooled in series using a single cooling-fluid channel within the FCEHA 102.

Figure 7:
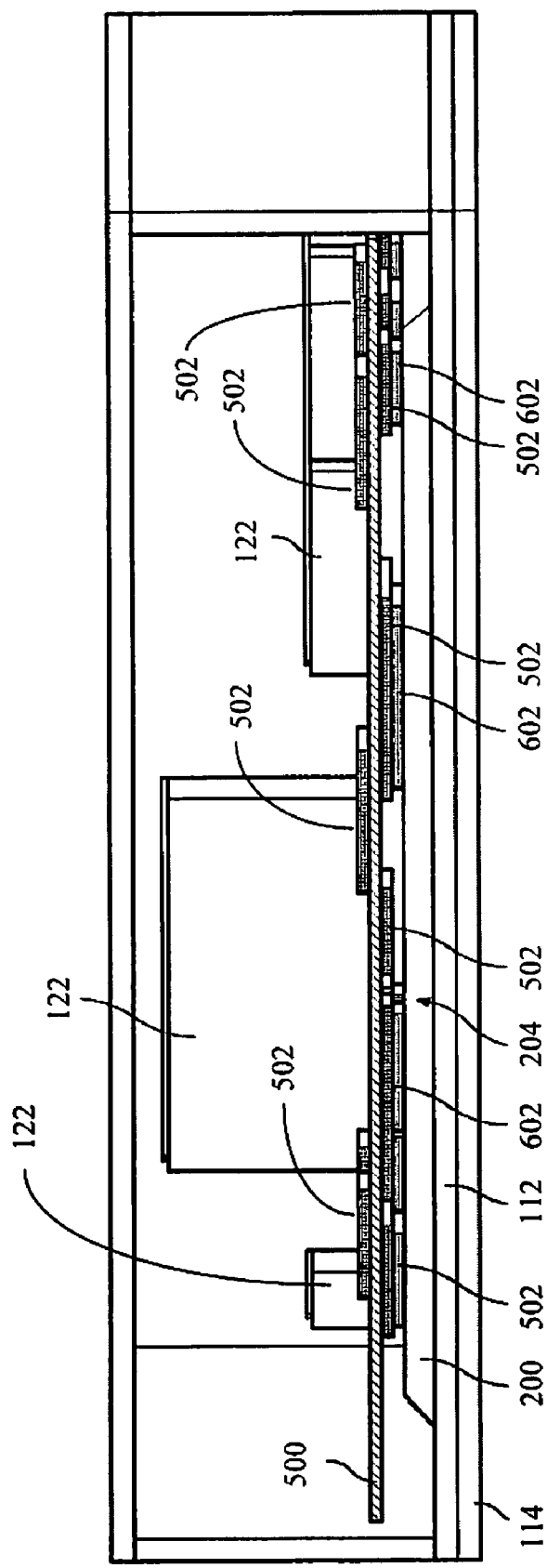
FIG. 7 is a partial side-sectional view through the FCEHA shown in FIG. 1.

In FIG. 7, a partial side-sectional view through the FCEHA 102 showing the sandwich structure of the FCEHA 102 and of the cooling fluid system. On the bottom side 116 of the FCEHA 102, the cover plate 114 is shown attached and/or mounted to the heat sink 112. Above the cover plate 114, the heat sink 112 is shown with the cooling-fluid channel 200 having the heat sink recessed-area 204 extending beyond the heat sink top-surface 202. The heat sink recessed-area 204 is shown with the plurality of electronic components 502 being in thermal contact with heat sink recessed-area 204 via the heat conducting pads 602. Some of the electronic components 502 may be in direct contact with the heat conducting pads 602 while others may be indirectly in contact with the heat conducting pads 602 via the PCB 500. The foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A fluid-cooled electronic housing assembly ("FCEHA") for use within a vehicle, the FCEHA comprising:
    a plurality of vertical side-walls;
    a heat sink attached to the plurality of vertical side-walls, wherein the heat sink includes
        a plurality of vertical channel-walls and
        a horizontal channel-wall positioned between the plurality of vertical channel-walls,
        wherein the plurality of vertical channel-walls and the horizontal channel-wall define a cooling-fluid channel within the heat sink; and
    wherein the plurality of side-walls and the heat sink define an inner space,
    wherein the inner space houses a plurality of electronic components of a vehicle infotainment system,
    wherein the FCEHA is configured to be mounted within a dashboard of the vehicle, and
    wherein the plurality of vertical side-walls includes
        a front side-wall,
        two mounting side-walls, and
        a back side-wall,
            wherein the two mounting side-walls are configured to be mounted to a support structure within the vehicle, and
            wherein the back side-wall is configured to be mounted with at least one electronic connector to electrically connect the FCEHA to the vehicle.

2. The FCEHA of claim 1, further including a cooling-fluid inlet and cooling-fluid outlet attached to the cooling-fluid channel and at least one of the verticals side-walls of the plurality of vertical side-walls.

3. The FCEHA of claim 2, further including a cover plate attached to the heat sink wherein the cover plate covers the cooling-fluid channel, and
    wherein the heat sink includes a heat sink top-surface and a heat sink bottom-surface, wherein the cooling-fluid channel defines a trench within the heat sink bottom-surface.

4. The FCEHA of claim 3, wherein the cover plate is removably attached to the heat sink.

5. The FCEHA of claim 3, wherein the heat sink and cover plate are metallic and the cover plate is brazed to the heat sink.

6. The FCEHA of claim 3,
    wherein the cooling-fluid channel protrudes from the heat sink top-surface to define a heat sink recessed-area, and
    wherein at least one electronic component of the plurality of electronic components is mounted on the heat sink recessed-area.

7. The FCEHA of claim 6, wherein the heat sink recessed-area is substantially planar with the heat sink top-surface.

8. The FCEHA of claim 6, further including at least one heat conducting pad mounted between the heat sink and the at least one electronic component.

9. The FCEHA of claim 1, further including a cooling-fluid inlet and cooling-fluid outlet attached to the cooling-fluid channel and at least one of the verticals side-walls of the plurality of vertical side-walls and wherein the two mounting side-walls are substantially free of air supply openings.

10. The FCEHA of claim 1, wherein the FCEHA is removably mounted to the vehicle.

11. A fluid-cooled electronic system ("FCES") for use within a vehicle, the FCES comprising:
    a plurality of electronic components of a vehicle infotainment system integrated in the FCES; and
    a fluid-cooled electronic housing assembly ("FCEHA") including
        a plurality of vertical side-walls; and
        a heat sink attached to the plurality of vertical side-walls, wherein the heat sink includes
            a plurality of vertical channel-walls and
            a horizontal channel-wall positioned between the plurality of vertical channel-walls,
            wherein the plurality of vertical channel-walls and the horizontal channel-wall define a cooling-fluid channel within the heat sink; and
        wherein the plurality of side-walls and the heat sink define an inner space,
        wherein the inner space houses the plurality of electronic components of the vehicle infotainment system,
        wherein the FCEHA is configured to be mounted within the vehicle to provide cooling of the FCES while maintaining a small space requirement of the FCES, and
        wherein the plurality of vertical side-walls includes
            a front side-wall,
            two mounting side-walls, and
            a back side-wall,
                wherein the two mounting side-walls are configured to be mounted to a support structure within the vehicle, and
                wherein the back side-wall is configured to be mounted with at least one electronic connector to electrically connect the FCES to the vehicle.

12. The FCES of claim 11, further including a cooling-fluid inlet and cooling-fluid outlet attached to the cooling-fluid channel and at least one of the verticals side-walls of the plurality of vertical side-walls.

13. The FCES of claim 12, further including a cover plate attached to the heat sink wherein the cover plate covers the cooling-fluid channel, and
    wherein the heat sink includes a heat sink top-surface and a heat sink bottom-surface, wherein the cooling-fluid channel defines a trench within the heat sink bottom-surface.

14. The FCES of claim 13, wherein the cover plate is removably attached to the heat sink.

15. The FCES of claim 13, wherein the heat sink and cover plate are metallic and the cover plate is brazed to the heat sink.

16. The FCES of claim 13,
    wherein the cooling-fluid channel protrudes from the heat sink top-surface to define a heat sink recessed-area, and wherein at least one electronic component of the plurality of electronic components is mounted on the heat sink recessed-area.

17. The FCES of claim 16, wherein the heat sink recessed-area is substantially planar with the heat sink top-surface.

18. The FCES of claim 16, further including at least one heat conducting pad mounted between the heat sink and the at least one electronic component.

19. The FCES of claim 11, further including a cooling-fluid inlet and cooling-fluid outlet attached to the cooling-fluid channel and at least one of the verticals side-walls of the plurality of vertical side-walls and wherein the two mounting side-walls are substantially free of air supply openings.

20. The FCES of claim 11, wherein the FCEHA is removably mounted to the vehicle.

21. The FCES of claim 11, wherein the plurality of electronic components are electronic components from infotainment components selected from the group consisting of
AM radio,
FM radio,
digital radio,
satellite radio,
cassette player,
Compact Disc ("CD") player,
DVD player,
MP3® player,
MP3® interface,
iPod® interface,
navigation system,
GPS system,
video sensor,
video game console,
hands-free cellular telephone system,
hands-free cellular telephone interface,
Bluetooth® interface, and
Internet interfaces.

* * * * *